United States Patent
Fan

(10) Patent No.: US 10,826,206 B1
(45) Date of Patent: Nov. 3, 2020

(54) CONDUCTIVE TERMINAL AND ELECTRICAL CONNECTING STRUCTURE

(71) Applicants: LITE-ON ELECTRONICS (GUANGZHOU) LIMITED, Guangzhou (CN); Lite-On Technology Corporation, Taipei (TW)

(72) Inventor: Pao-Hsiu Fan, Taipei (TW)

(73) Assignees: LITE-ON ELECTRONICS (GUANGZHOU) LIMITED, Guangzhou (CN); Lite-On Technology Corporation, Taipei (TW)

( * ) Notice: Subject to any disclaimer, the term of this patent is extended or adjusted under 35 U.S.C. 154(b) by 0 days.

(21) Appl. No.: 16/532,460

(22) Filed: Aug. 5, 2019

(30) Foreign Application Priority Data

Apr. 29, 2019 (CN) .......................... 2019 1 0352871

(51) Int. Cl.
*H05K 1/11* (2006.01)
*H01R 12/58* (2011.01)
*H01R 4/02* (2006.01)
*H05K 1/18* (2006.01)

(52) U.S. Cl.
CPC ........... *H01R 12/585* (2013.01); *H01R 4/029* (2013.01); *H05K 1/184* (2013.01); *H05K 2201/10295* (2013.01); *H05K 2201/10356* (2013.01)

(58) Field of Classification Search
CPC .................. H01R 4/029; H05K 1/184; H05K 2201/10295; H05K 2201/10356

USPC ......................................................... 174/266
See application file for complete search history.

(56) References Cited

U.S. PATENT DOCUMENTS

2010/0093197 A1  4/2010  Sander

FOREIGN PATENT DOCUMENTS

TW          I276257          3/2007

OTHER PUBLICATIONS

"Office Action of Taiwan Counterpart Application," dated Dec. 23, 2019, p. 1-p. 8.

*Primary Examiner* — Tremesha S Willis
(74) *Attorney, Agent, or Firm* — JCIPRNET

(57) ABSTRACT

A conductive terminal includes a holding portion, a positioning portion and a welding portion. The positioning portion is connected to the holding portion and includes two positioning branches separated by a first trench. The welding portion is connected to the positioning portion and the positioning portion is located between the holding portion and the welding portion. The welding portion includes two welding branches separated by a second trench, wherein the first trench is communicated with the second trench and each of the welding branches is connected to one of the positioning branches. The positioning portion has a first outer diameter, and a second outer diameter on at least part of the welding portion is greater than the first outer diameter. An electrical connecting structure is further provided.

16 Claims, 6 Drawing Sheets

US 10,826,206 B1

CONDUCTIVE TERMINAL AND ELECTRICAL CONNECTING STRUCTURE

CROSS-REFERENCE TO RELATED APPLICATION

This application claims the priority benefit of Chinese patent application serial no. 201910352871.2, filed on Apr. 29, 2019. The entirety of the above-mentioned patent application is hereby incorporated by reference herein and made a part of this specification.

BACKGROUND

Technical Field

The disclosure relates to a terminal and a connecting structure, and particularly relates to a conductive terminal and an electrical connecting structure.

Description of Related Art

A common electrical connecting structure includes a circuit board and a conductive terminal welded to the circuit board. The circuit board has a through hole, and the conductive terminal is plugged in and passes through the through hole. Furthermore, the conductive terminal includes a cardioid holding portion configured to clamp an internal wire, and the cardioid holding portion is plugged in and passes through the through hole. During the process of welding the conductive terminal to the circuit board, the conductive terminal should be plugged in and pass through the through hole of the circuit board firstly, and let the cardioid holding portion be positioned in the through hole approximately. Then, coating solder to the through hole. Afterwards, the solder is heated, such that the conductive terminal is bonded to the circuit board through the solder.

However, since there is an excessive gap between the cardioid holding portion and an inner wall of the through hole, holes (e.g., pin holes) are easily formed on the cured solder, which seriously affect reliability of the electrical connecting structure. For example, with the pin holes formed, it leads to insufficient bonding strength between the conductive terminal and the circuit board, such that the conductive terminal is easily detached from the through hole. Or, with the pin holes formed, it leads to significantly decrease on stability of current or signal transmission between the conductive terminal and the circuit board. Currently, filling solders into the pin holes is the mostly seen repair, but it would increase time cost and lower efficiency.

SUMMARY

The disclosure provides a conductive terminal, which enhance yield rate and efficiency of the manufacturing process.

The disclosure provides an electrical connecting structure has good reliability.

A conductive terminal of an embodiment of the disclosure, which includes a holding portion, a positioning portion, and a welding portion. The positioning portion is connected to a holding portion. The positioning portion includes two positioning branches separated by a first trench. The welding portion is connected to the positioning portion, and the positioning portion is located between the holding portion and the welding portion. The welding portion includes two welding branches separated by a second trench. The first trench is communicated with the second trench and each of the welding branches is connected to one of the positioning branches. The positioning portion has a first outer diameter, and a second outer diameter on at least part of the welding portion is greater than the first outer diameter.

An electrical connecting structure of an embodiment of the disclosure, which includes a circuit board and a conductive terminal. The circuit board has a through hole. The conductive terminal includes a holding portion, a positioning portion, and a welding portion. The holding portion clamps an internal wire. The positioning portion is connected to the holding portion, and plugged in the through hole. The positioning portion includes two positioning branches separated by the first trench. The welding portion is connected to the positioning portion, and the positioning portion is located between the holding portion and the welding portion. The welding portion and the holding portion are located outside of the through hole, and are located at two opposite sides of the circuit board respectively. The welding portion includes two welding branches separated by the second trench. The first trench is communicated with the second trench and each of the welding branches is connected to one of the positioning branches. The positioning portion has a first outer diameter, and a second outer diameter on at least part of the welding portion is greater than the first outer diameter.

Based on the above, the conductive terminal of the disclosure is configured with a trench. During the process of mounting and welding the conductive terminal to the circuit board, the trench may be configured as a flow path of solder and let the solder be more completely coated and filled. As such, holes (e.g., pin holes) formed on the cured solder can be avoided, which enhance yield rate and efficiency of the manufacturing process. In this way, not only is the bonding strength between the conductive terminal and the circuit board enhanced, the stability of current or signal transmission between the conductive terminal and the circuit board is also enhanced, such that the electrical connecting structure of the disclosure has good reliability.

To provide a further understanding of the aforementioned and other features and advantages of the disclosure, exemplary embodiments, together with the reference drawings, are described in detail below.

BRIEF DESCRIPTION OF THE DRAWINGS

The accompanying drawings are included to provide a further understanding of the disclosure, and are incorporated in and constitute a part of this specification. The drawings illustrate exemplary embodiments of the disclosure and, together with the description, serve to explain the principles of the disclosure.

DESCRIPTION OF THE EMBODIMENTS

Figure 1A:
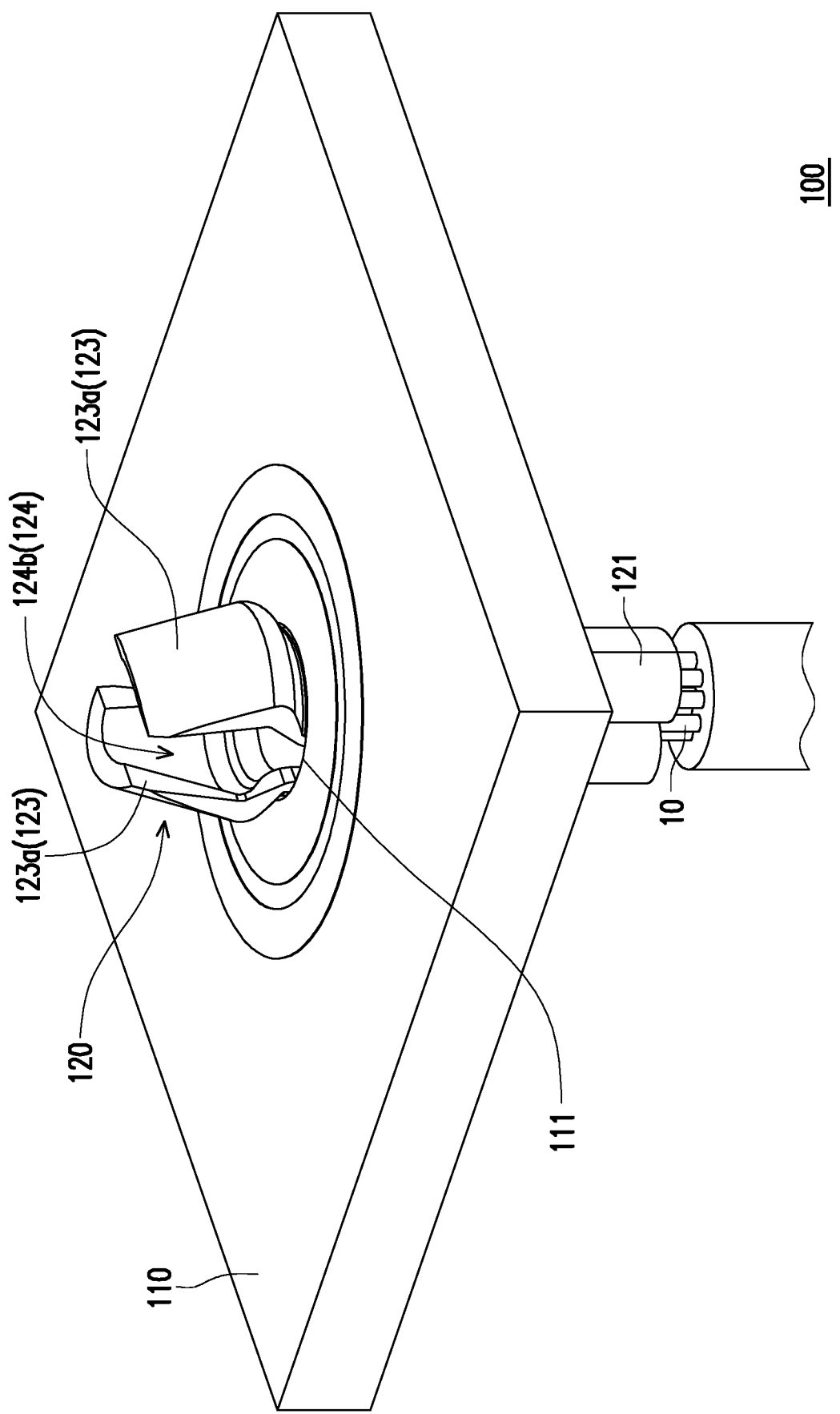
FIG. 1A is a schematic diagram illustrating an electrical connecting structure of an embodiment of the disclosure.

FIG. 1A is a schematic diagram illustrating an electrical connecting structure of an embodiment of the disclosure.

Figure 1B:
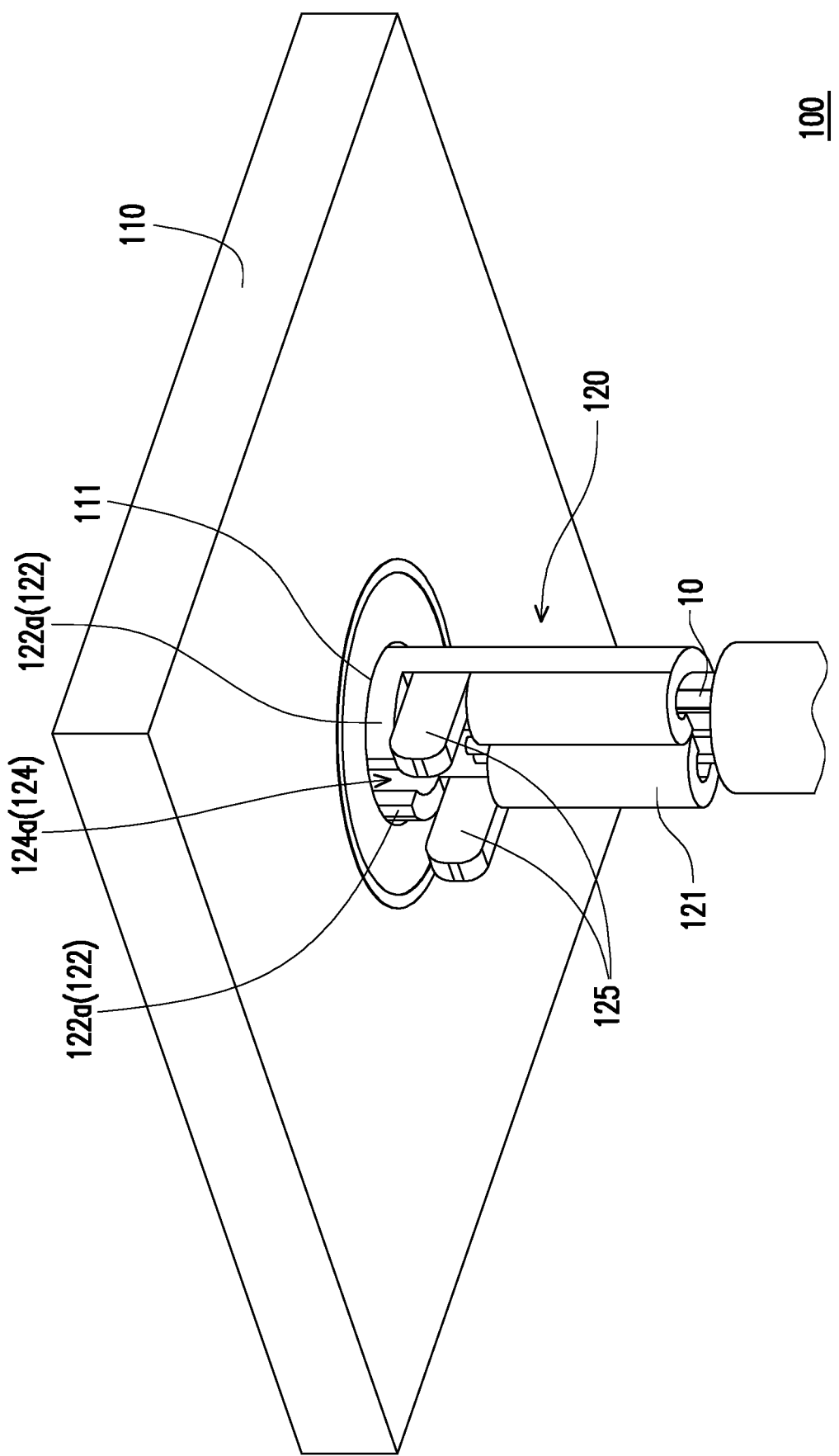
FIG. 1B is a schematic diagram illustrating the electrical connecting structure of FIG. 1A in another perspective.
Figure 2:
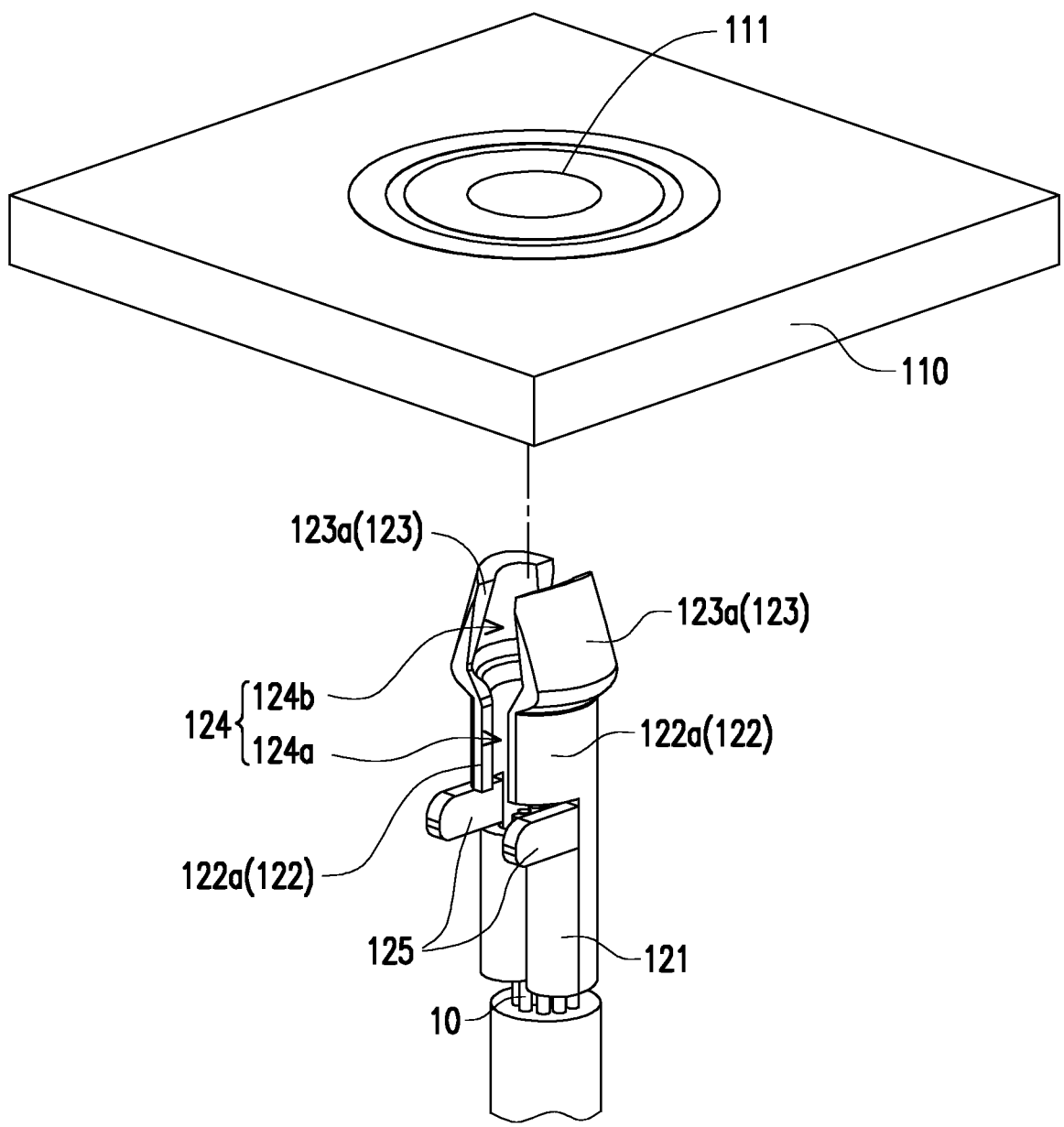
FIG. 2 is a schematic exploded diagram illustrating the electrical connecting structure of FIG. 1A.

FIG. 1B is a schematic diagram illustrating the electrical connecting structure of FIG. 1A in another perspective. FIG. 2 is a schematic exploded diagram illustrating the electrical connecting structure of FIG. 1A. Please refer to FIG. 1A, FIG. 1B, and FIG. 2, in this embodiment, an electrical connecting structure 100 may be applied to any kind of electronic devices, such as a laptop, a desktop, a server, or a power supply, etc., to transmit current or signal. The electrical connecting structure 100 may include a circuit board 110 and a conductive terminal 120. The circuit board 110 may be a rigid circuit board, a flexible circuit board, or a rigid-flex circuit board, and has a through hole 111 which is configured to mount the conductive terminal 120.

The conductive terminal 120 may be an integrally formed structure, and manufactured by a metal or an alloy having good conductivity. Specifically, the conductive terminal 120 includes a holding portion 121, a positioning portion 122, and a welding portion 123. The holding portion 121 is configured to clamp an internal wire 10, and the holding portion 121 may be a cardioid holding portion. On the other hand, the positioning portion 122 is connected to the holding portion 121, and is extended from one side of the holding portion 121. The welding portion 123 is connected to the positioning portion 122. The welding portion 123 is extended from one side of the positioning portion 122, and the positioning portion 122 is located between the holding portion 121 and the welding portion 123.

Figure 3A:
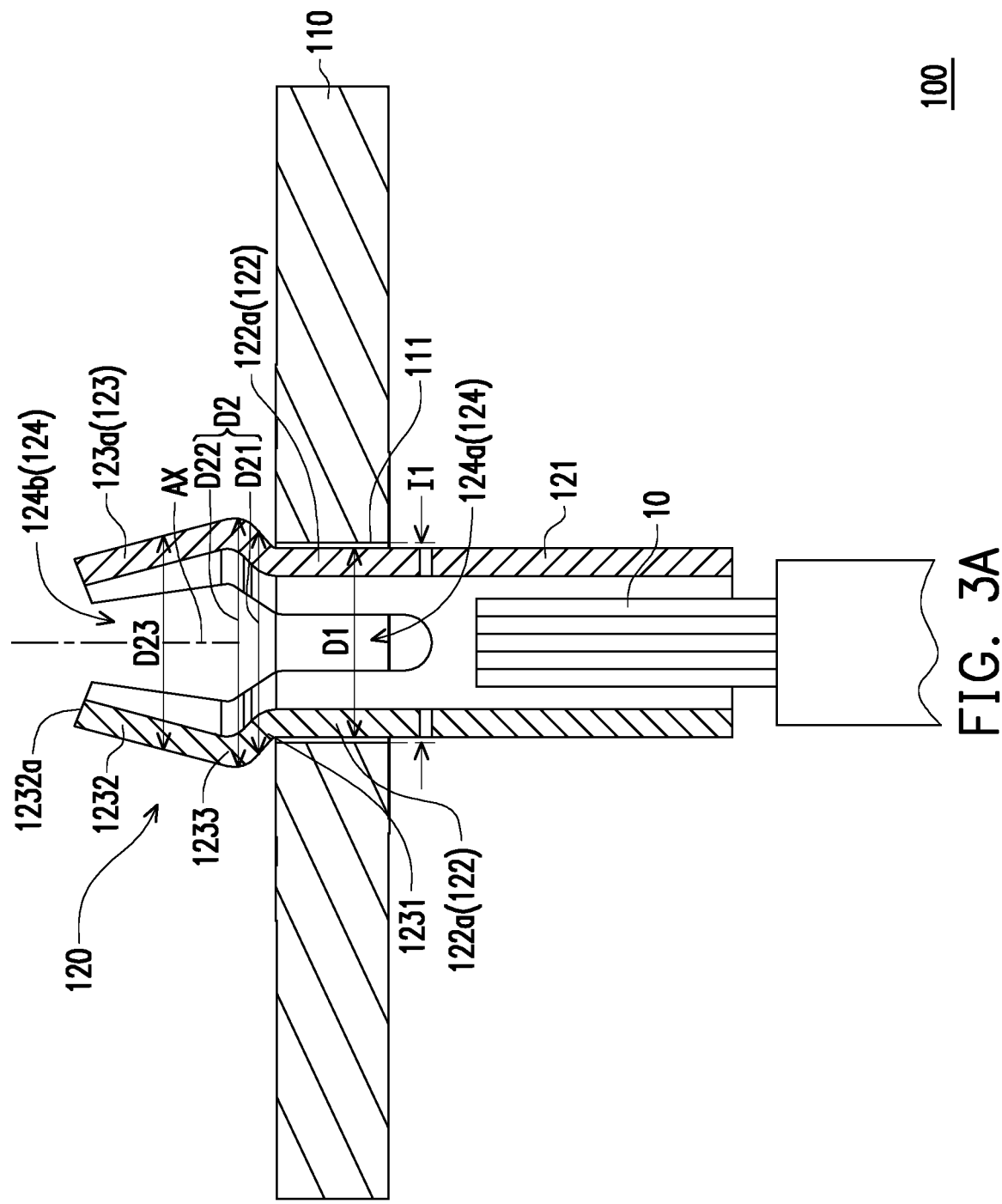
FIG. 3A and FIG. 3B are schematic diagrams illustrating the electrical connecting structure of FIG. 1A along two different cross-sections.
Figure 3B:
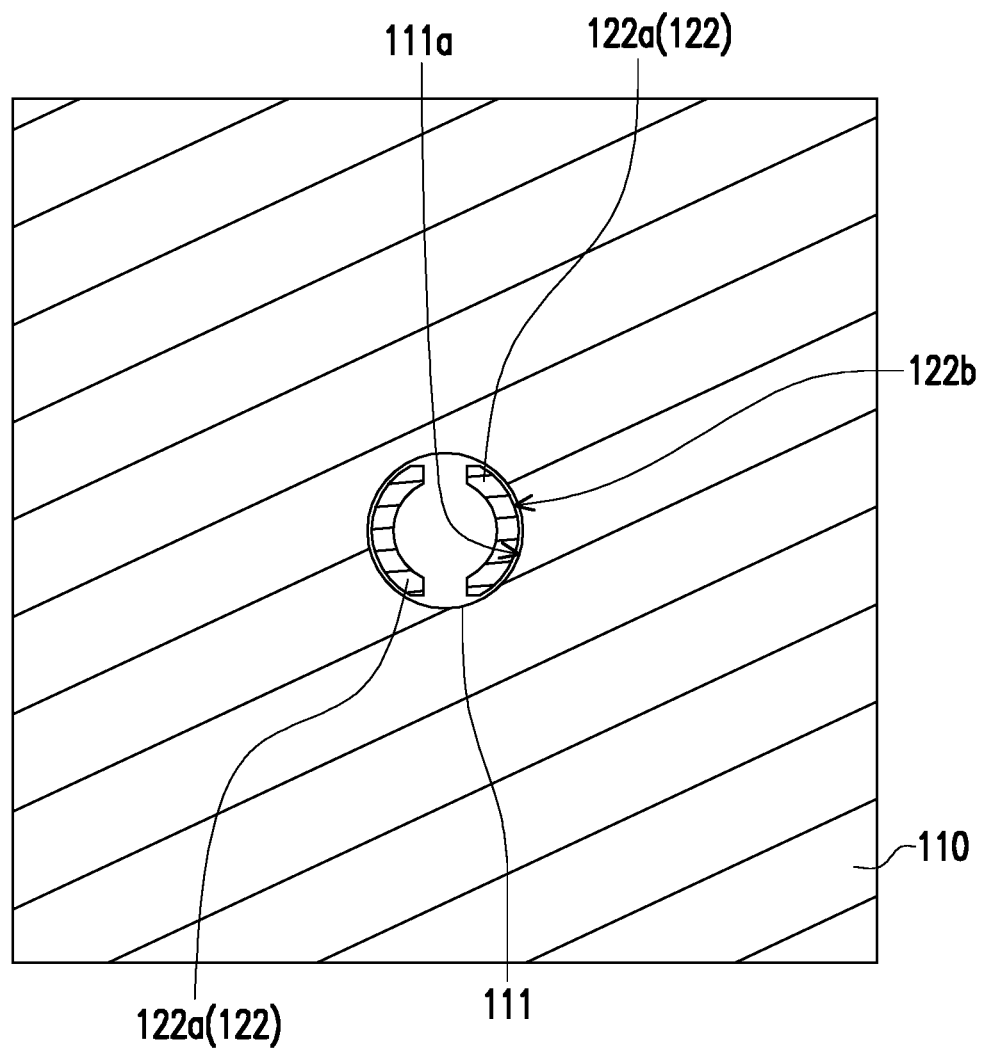
Figure 4:
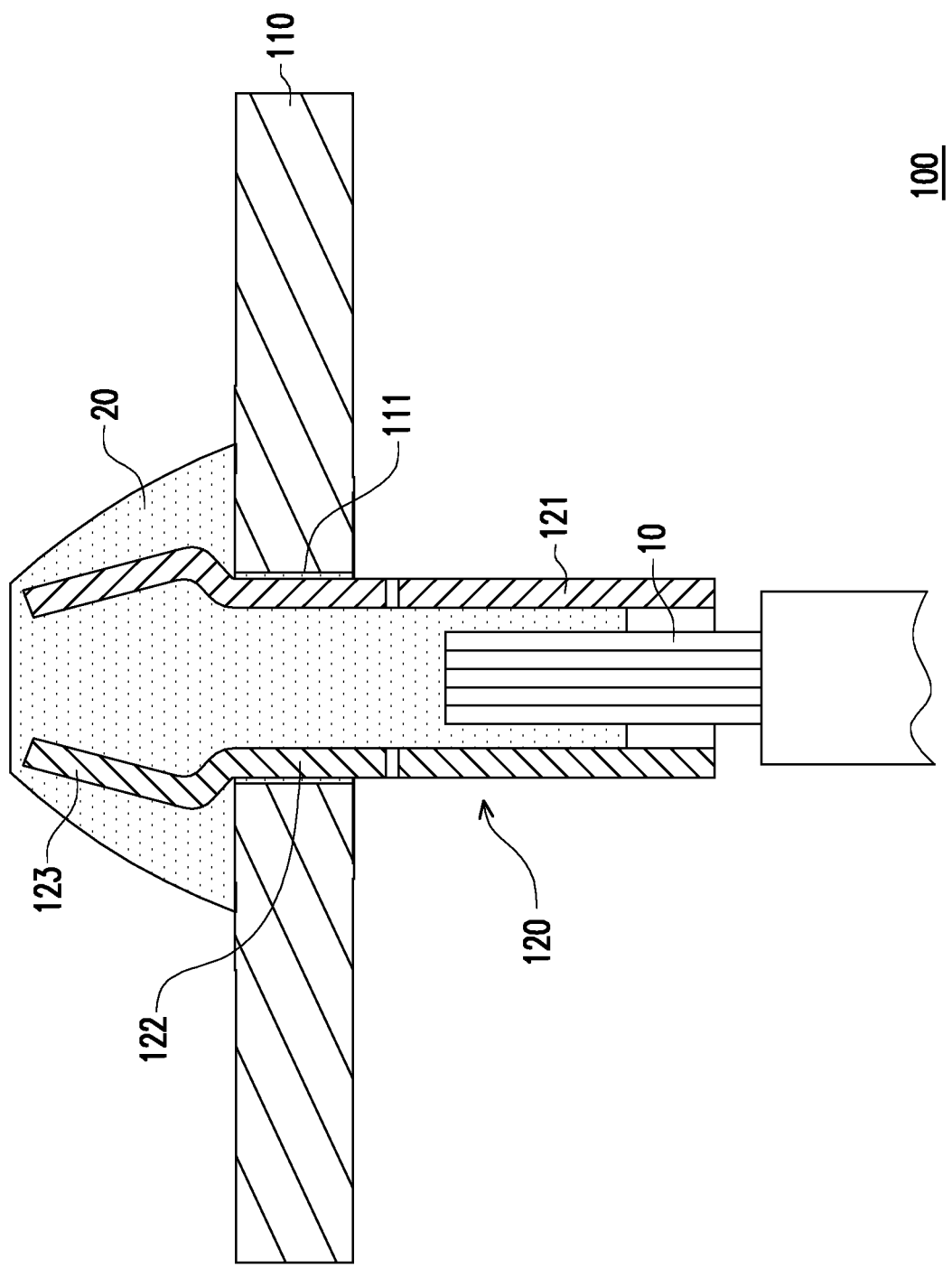
FIG. 4 is a schematic diagram illustrating the electrical connecting structure of FIG. 3A after welding.

FIG. 3A and FIG. 3B are schematic diagrams illustrating the electrical connecting structure of FIG. 1A along two different cross-sections. FIG. 4 is a schematic diagram illustrating the electrical connecting structure of FIG. 3A after welding. Please refer to FIG. 1A, FIG. 1B, and FIG. 3A, after the conductive terminal 120 is mounted to the through hole 111, the positioning portion 122 is plugged in the through hole 111, and the welding portion 123 and the holding portion 121 are located outside of the through hole 111, and the welding portion 123 and the holding portion 121 are located at two opposite sides of the circuit board 110 respectively. On the other hand, the internal wire 10 is clamped to the holding portion 121, and the internal wire 10 is thus located outside of the through hole 111. Furthermore, the positioning portion 122 has a first outer diameter D1. The first outer diameter D1 is slightly smaller than an inner diameter I1 of the through hole 111, and at least part of the second outer diameter D2 of the welding portion 123 is greater than the first outer diameter D1 and the inner diameter I1. Hence, when the welding portion 123 passes through the circuit board 110 and the positioning portion 122 is plugged in the through hole 111, the welding portion 123 that is located outside of the through hole 111 and moved toward the circuit board 110 would be structurally interfered with the circuit board 110, such that the conductive terminal 120 would not be easily detached from the through hole 111.

In this embodiment, the conductive terminal 120 is configured with a trench 124. The trench 124 penetrates from a terminal end of the welding portion 123 to the positioning portion 122, and stops before the holding portion 121. Specifically, the trench 124 may be generally divided into a first trench 124a and a second trench 124b communicated with each other. The positioning portion 122 is divided by the first trench 124a into two positioning branches 122a separated from each other, and the welding portion 123 is divided by the second trench 124b into two welding branches 123a separated from each other. The two positioning branches 122a and the two welding branches 123a are in a one-to-one configuration. That is, each of the welding branches 123a is connected to one of the positioning branches 122a.

During the process of mounting and welding the conductive terminal 120 to the circuit board 110, the trench 124 may be configured as a flow path of a solder 20 and let the solder 20 be more completely coated and filled. As such, holes (e.g., pin holes) formed on the cured solder 20 can be avoided, which enhance yield rate and efficiency of the manufacturing process, as illustrated in FIG. 3A and FIG. 4. In this way, not only is the bonding strength between the conductive terminal 120 and the circuit board 110 enhanced, the stability of current or signal transmission between the conductive terminal 120 and the circuit board 110 is also enhanced, such that the electrical connecting structure of the disclosure has good reliability.

As illustrated in FIG. 3A and FIG. 4, the solder 20 completely encapsulates the welding portion 123 and the positioning portion 122. The solder 20 is not only filled into the through hole 111 and filled up the trench 124, but filled into the holding portion 121 to encapsulate the internal wire 10. Therefore, the joint area and the bonding strength of the conductive terminal 120 and the solder 20 may be greatly enhanced.

Please refer to FIG. 3A, the welding portion 123 includes a first extending segment 1231 connected to the positioning portion 122 and a second extending segment 1232 connected to the first extending segment 1231. In addition, there is an inflection 1233 between the first extending segment 1231 and the second extending segment 1232. Specifically, the conductive terminal 120 is a hollow structure. The conductive terminal 120 has a central axis AX, and the first extending segment 1231 and the second extending segment 1232 are tilted to the AX. In this embodiment, a second outer diameter D21 of the welding portion 123 on the first extending segment 1231 is gradually increased from the positioning portion 122 toward the inflection 1233. A second outer diameter D22 of the welding portion 123 on the inflection 1233 is greater than the second outer diameter D21. On the other hand, the second outer diameter D22 and the second outer diameter D21 may be severed as a part of the second outer diameter D2, and is greater than the inner diameter I1 of the through hole 111 and the first outer diameter D1 of the positioning portion 122.

Continued to the above, the greatest outer diameter of the welding portion 123 substantially falls on the inflection 1233, and a second outer diameter D23 of the welding portion 123 on the second extending segment 1232 is gradually decreased from the inflection 1233 toward a direction away from the first extending segment 1231. In other words, the outer diameter of the welding portion 123 of the conductive terminal 120 is gradually increased from a terminal end 1232a of the second extending segment 1232 to the inflection 1233, and is gradually decreased from the inflection 1233 to the positioning portion 122. The outer diameter design facilitates the process of plugging the conductive terminal 120 to the circuit board 110.

Moreover, the second extending segment 1232 of the welding portion 123 is a forward guiding structure. The second outer diameter D23 on the terminal end 1232a of the second extending segment 1232 is smaller than or equal to the first outer diameter D1 of the positioning portion 122, and the second outer diameter D23 on the terminal end 1232a of the second extending segment 1232 is smaller than the inner diameter I1 of the through hole 111. Thus, during the process that the welding portion 123 passes through the through hole 111, the terminal end 1232a of the welding portion 123 would not be interfered with the circuit board 110 or the through hole 111. Based on the outer diameter of the welding portion 123 is gradually increased from the terminal end 1232a of the second extending segment 1232 to the inflection 1233, and the welding portion 123 is elastically deformed because of the trench 124 as the depth of the welding portion 123 plugged into the through hole 111 increased, the welding portion 123 can thus successfully pass through the through hole 111. After the welding portion 123 passes through the through hole 111, the welding portion 123 elastically returns to the state without enduring force and deforming, and the positioning portion 122 is thus plugged in the through hole 111.

Please refer to FIG. 1A, FIG. 1B, and FIG. 3B, in this embodiment, each of the positioning branches 122a of the positioning portion 122 has an outer wall surface 122b facing an inner wall surface 111a of the through hole 111, and the ratio of the arc length of the outer wall surface 122b of each of the positioning branches 122a to the circumference of the inner wall surface 111a of the through hole 111 is greater than or equal to 40%. Accordingly, if the positioning portion 122 is shifted in the through hole 111, the two positioning branches 122a push against the inner wall 111a of the through hole 111 and drive the positioning portion 122 to reset, such that the positioning portion 122 substantially remains in the center of the through hole 111.

Please refer to FIG. 1A, FIG. 1B, and FIG. 2, the conductive terminal 120 further includes a position-limiting protrusion 125. The position-limiting protrusion 125 is located between the positioning portion 122 and the holding portion 121. In addition, the number of the position-limiting protrusions 125 may be two or increase/decrease based on design needs. After the positioning portion 122 plugged into the through hole 111, the position-limiting protrusion 125 can achieve a stopping effect and thus prevent the holding portion 121 from being plugged into the through hole 111. At this time, the position-limiting protrusion 125 is located outsides of the through hole 111. Besides, the welding portion 123 and the position-limiting protrusion 125 are located at two opposite sides of the circuit board 110.

It should be specifically noted that the number of the positioning branches 122a of the positioning portion 122 is the same as the number of the welding branches 123a of the welding portion 123. The number of the positioning branches 122a and the number of the welding branches 123a of the welding portion 123 are at least two. In addition, the positioning branches 122a and the welding portions 123 are in symmetric arrangement, isometric arrangement, or ring arrangement according to the central axis AX of the conductive terminal 120 that is served as a basis.

In summary of the foregoing, the conductive terminal of the disclosure is configured with a trench. During the process of mounting and welding the conductive terminal to the circuit board, the trench may be configured as a flow path of solder and let the solder be more completely coated and filled. As such, holes (e.g., pin holes) formed on the cured solder can be avoided, which enhance yield rate and efficiency of the manufacturing process. In this way, not only is the bonding strength between the conductive terminal and the circuit board enhanced, the stability of current or signal transmission between the conductive terminal and the circuit board is also enhanced, such that the electrical connecting structure of the disclosure has good reliability.

On the other hand, since the outer diameter of the welding portion of the conductive terminal of the disclosure is gradually increased from terminal end thereof to the inflection, and is gradually decreased from the inflection to the positioning portion, the outer diameter design facilitates the process of plugging the conductive terminal to the circuit board. Furthermore, since at least part of the second outer diameter of the welding portion is greater than the inner diameter of the through hole, when the welding portion passes through the circuit board and the positioning portion is plugged in the through hole, the welding portion that is located outside of the through hole and moved toward the circuit board would be structurally interfered with the circuit board, such that the conductive terminal would not be easily detached from the through hole. In addition, the ratio of the arc length of the outer wall surface of each of the positioning branches to the circumference of the inner wall surface of the through hole is greater than or equal to 40%. Accordingly, if the positioning portion is shifted in the through hole, the two positioning branches push against the inner wall of the through hole and drive the positioning portion to reset, such that the positioning portion substantially remains in the center of the through hole.

Although the disclosure is disclosed as the embodiments above, the embodiments are not meant to limit the disclosure. Any person skilled in the art may make slight modifications and variations without departing from the spirit and scope of the disclosure. Therefore, the protection scope of the disclosure shall be defined by the claims attached below.

What is claimed is:
1. A conductive terminal, comprising:
    a holding portion;
    a positioning portion, connected to the holding portion, the positioning portion comprising two positioning branches separated by a first trench; and
    a welding portion, connected to the positioning portion, and the positioning portion being located between the holding portion and the welding portion, the welding portion comprising two welding branches separated by a second trench, wherein the first trench is communicated with the second trench and each of the welding branches is connected to one of the positioning branches,
    wherein the positioning portion has a first outer diameter, and a second outer diameter on at least part of the welding portion is greater than the first outer diameter,
    wherein an inner diameter of the first trench is smaller than an inner diameter of the second trench, and the inner diameter of the second trench is gradually increased and then gradually decreased along a direction away from the first trench.
2. The conductive terminal according to claim 1, wherein the welding portion comprises a first extending segment connected to the positioning portion and a second extending segment connected to the first extending segment, and there is an inflection between the first extending segment and the second extending segment.
3. The conductive terminal according to claim 2, wherein the second outer diameter of the welding portion on the first extending segment is gradually increased from the positioning portion toward the inflection, the second outer diameter of the welding portion on the second extending segment is gradually decreased from the inflection toward a direction away from the first extending segment.
4. The conductive terminal according to claim 2, wherein the second extending segment of the welding portion has a terminal end away from the inflection, and the second outer diameter of the welding portion on the terminal end is smaller than or equal to the first outer diameter of the positioning portion.

5. The conductive terminal according to claim 2, wherein the second outer diameter of the welding portion on the first extending segment and on the inflection is greater than the first outer diameter of the positioning portion.

6. The conductive terminal according to claim 1, further comprising:
a position-limiting protrusion, located between the positioning portion and the holding portion.

7. An electrical connecting structure, comprising:
a circuit board, having a through hole;
a conductive terminal, comprising:
a holding portion, clamping an internal wire;
a positioning portion, connected to the holding portion, and plugged in the though hole, the positioning portion comprising two positioning branches separated by a first trench; and
a welding portion, connected to the positioning portion, and the positioning portion being located between the holding portion and the welding portion, the welding portion and the holding portion being located outside of the through hole, and the welding portion and the holding portion being located at two opposite sides of the circuit board respectively, the welding portion comprising two welding branches separated by a second trench, wherein the first trench is communicated with the second trench and each of the welding branches is connected to one of the positioning branches, wherein the positioning portion has a first outer diameter, and a second outer diameter on at least part of the welding portion is greater than the first outer diameter; and
a solder, encapsulating the welding portion and the positioning portion, wherein the solder is filled into the through hole, and the solder is filled up the first trench and the second trench to encapsulate the internal wire.

8. The electrical connecting structure according to claim 7, wherein the welding portion comprises a first extending segment connected to the positioning portion and a second extending segment connected to the first extending segment, and there is an inflection between the first extending segment and the second extending segment.

9. The electrical connecting structure according to claim 8, wherein the second outer diameter of the welding portion on the first extending segment is gradually increased from the positioning portion toward the inflection, the second outer diameter of the welding portion on the second extending segment is gradually decreased from the inflection toward a direction away from the first extending segment.

10. The electrical connecting structure according to claim 8, wherein the second extending segment of the welding portion has a terminal end away from the inflection, and the second outer diameter of the welding portion on the terminal end is smaller than or equal to the first outer diameter of the positioning portion.

11. The electrical connecting structure according to claim 8, wherein the second outer diameter of the welding portion on the first extending segment and on the inflection is greater than the first outer diameter of the positioning portion.

12. The electrical connecting structure according to claim 8, wherein the second extending segment of the welding portion has a terminal end away from the inflection, and the second outer diameter of the welding portion on the terminal end is smaller than an inner diameter of the through hole.

13. The electrical connecting structure according to claim 7, wherein the conductive terminal further comprises a position-limiting protrusion located between the positioning portion and the holding portion, the position-limiting protrusion is located outside of the through hole, and the welding portion and the position-limiting protrusion are located at two opposite sides of the circuit board respectively.

14. The electrical connecting structure according to claim 7, wherein each of the positioning branches has an outer wall surface facing an inner wall surface of the through hole, and the ratio of the arc length of the outer wall surface of each of the positioning branches to the circumference of the inner wall surface of the through hole is greater than or equal to 40%.

15. The electrical connecting structure according to claim 7, wherein at least part of the second outer diameter of the welding portion is greater than an inner diameter of the through hole.

16. The electrical connecting structure according to claim 7, wherein an inner diameter of the first trench is smaller than an inner diameter of the second trench, and the inner diameter of the second trench is gradually increased and then gradually decreased along a direction away from the first trench.

* * * * *